US006901018B2

(12) United States Patent
Bae et al.

(10) Patent No.: US 6,901,018 B2
(45) Date of Patent: May 31, 2005

(54) METHOD OF GENERATING INITIALIZING SIGNAL IN SEMICONDUCTOR MEMORY DEVICE

(75) Inventors: Il-Man Bae, Kyungki-do (KR); Jae-Hoon Kim, Kyungki-do (KR); Jae-Hyeong Lee, Kyungki-do (KR)

(73) Assignee: Samsung Electronics Co, Ltd., Suwon-si (KR)

( * ) Notice: Subject to any disclaimer, the term of this patent is extended or adjusted under 35 U.S.C. 154(b) by 0 days.

(21) Appl. No.: 10/632,572

(22) Filed: Aug. 1, 2003

(65) Prior Publication Data

US 2004/0027910 A1 Feb. 12, 2004

Related U.S. Application Data

(63) Continuation-in-part of application No. 10/187,718, filed on Jul. 1, 2002.

(30) Foreign Application Priority Data

Jul. 18, 2001 (KR) ........................................ 2001-43111
Jul. 5, 2002 (KR) ................................ 10-2002-0038893

(51) Int. Cl.[7] ................................................. G11C 7/00
(52) U.S. Cl. ....................... 365/203; 365/149; 365/233
(58) Field of Search ................................ 365/203, 149, 365/233

(56) References Cited

U.S. PATENT DOCUMENTS 5,703,475 A 12/1997 Lee et al. .................. 323/313
5,812,491 A 9/1998 Shinozaki et al.
5,822,766 A 10/1998 Purdham et al. ............ 711/148
5,887,162 A 3/1999 Williams et al.
5,896,551 A 4/1999 Williams et al.
5,905,909 A 5/1999 Williams et al.
5,982,704 A 11/1999 Kim ...................... 365/230.08
6,081,460 A 6/2000 Lim et al. .............. 365/189.11
6,084,803 A 7/2000 Sredanovic et al.
6,178,501 B1 1/2001 Ingalls
6,633,804 B2 10/2003 Dix et al. ..................... 701/50
2001/0000820 A1 5/2001 Keeth et al.

OTHER PUBLICATIONS

Micron Technology, Inc., "MT41LC256K32D4 Synchronous Graphics Ram," Preliminary Specification booklet, 45 pgs., 1997.

*Primary Examiner*—Hoai Ho
(74) *Attorney, Agent, or Firm*—Marger Johnson & McCollom

(57) ABSTRACT

A method for generating an initializing signal capable of preventing inner circuits installed in a semiconductor memory device from being initially unstably operated due to the application of external electric power. The method includes the steps of: (a) receiving a precharge command for precharging the semiconductor memory device; (b) activating the initializing signal to a first level in response to the received precharge command; (c) receiving a refresh command for refreshing the semiconductor memory device after receipt of the precharge command; (d) receiving a mode set command for setting an operational mode of the semiconductor memory device after receipt of the refresh command; and (e) deactivating the initializing signal to a second level in response to the received mode set command. An alternative method includes the step of (a) receiving a mode set command foe initializing an inner circuit in a semiconductor memory device and (b) generating a control signal in response to the received mode set command and using the control signal as the initializing signal.

8 Claims, 7 Drawing Sheets

METHOD OF GENERATING INITIALIZING SIGNAL IN SEMICONDUCTOR MEMORY DEVICE

This application is a continuation in part of U.S. patent application Ser. No. 10/187,718 filed on Jul. 1, 2002, now pending, which claims priority from Korean application No. 2001-43111 filed Jul. 18, 2001 and Korean priority No. 2002-38893 filed Jul. 5, 2002 is herein incorporated by reference.

BACKGROUND OF THE INVENTION

1. Field of the Invention

The present invention relates to a semiconductor memory device, and more particularly, to a method of generating an initializing signal capable of preventing unstable operations of inner circuits when a semiconductor memory device is powered on.

2. Description of the Related Art

Power-up is to apply external electric power to a semiconductor memory device for operating the same. A semiconductor memory device includes an initializing circuit in order to prevent inner circuits from being unstably operated during power-up. Here, the unstable operations of the inner circuits mean that whether data in a circuit is logic 'high' or logic 'low' is difficult to be determined in a power-up operation section because external electric power is not completely stabilized. The unstable operations of the inner circuits can be prevented by latching the inner circuits through an initializing signal that is temporarily logic 'high' but drops to logic 'low' during the power-up.

FIG. 1 is a view of an initializing circuit 100 capable of preventing unstable operations of inner circuits of a semiconductor memory device upon power-up. Referring to FIG. 1, the initializing circuit 100 includes a PMOS transistor MP1, a capacitor CAP, a resistor R1 and inverters I11 through I13. In the operation of the initializing circuit 100, an initializing signal VCCHB output from the initializing circuit 100 becomes larger due to an increase in a voltage level when external electric power EVC from an outer source is applied to the initializing circuit 100 and the voltage level of the external electric power EVC is raised. If the voltage level of the external electric power EVC is above a predetermined level, the voltage of the initializing circuit 100 is adjusted so that a first node N11 becomes a logic 'high' level. Once the first node N11 is recognized as logic 'high', the initializing signal VCCHB is generated to be logic 'low' by the inverters I11 through I13. Here, the initializing pulse signal VCCHB is used for preventing unstable operation of the inner circuits of a semiconductor memory device during power-up operation.

FIG. 2 shows an example of a method of initializing the inner circuits of a semiconductor memory device using an initializing signal. In the operation of the circuit shown in FIG. 2, an input signal IN is inactive during power-up, and therefore a first node N21 is in an unstable state. At this time, when a logic 'high' initializing signal VCCHB is input, a PMOS transistor MP2 is turned on by an inverter I21 and the first node N21 is latched to the logic 'high' level and stabilized. As a result, variations in an output signal OUT can be prevented. When the initializing signal VCCHB is transited to the logic 'low' level, the PMOS transistor MP2 is turned off and the first node N21 remains latched to the logic 'high' level. As described above, the initializing signal VCCHB sets each of the nodes of the inner circuit of a semiconductor memory device to a predetermined logic level upon power-up.

However, the initializing circuit 100 has problems in that it has a large layout area and consumes power while the semiconductor memory device operates, even after the initializing signal VCCHB is generated. Further, the current trend is to reduce the voltage of the external electric power EVC (to conserve power and increase speed), thus lessening a voltage level of the initializing signal VCCHB. This causes the initializing signal VCCHB to fail to fulfill the function of preventing unstable operation of the inner circuits.

In contrast, a method of generating an initializing signal according to the present invention can reduce the layout area and power consumption of an initializing circuit during power-up.

SUMMARY OF THE INVENTION

To solve the above problems, it is an objective of the present invention to provide a method of generating an initializing signal capable of reducing the layout area and power consumption of an initializing circuit during power-up.

Accordingly, to achieve one aspect of the above objective, there is provided a method of generating an initializing signal, the method including the steps of: (a) receiving a precharge command for precharging the semiconductor memory device; (b) activating the initializing signal to a first level in response to the received precharge command; (c) receiving a refresh command for refreshing the semiconductor memory device after receipt of the precharge command; (d) receiving a mode set command for setting an operational mode of the semiconductor memory device after receipt of the refresh command; and (e) deactivating the initializing signal to a second level in response to the received mode set command.

To achieve another aspect of the above objective, there is provided a method for generating an initializing signal including the steps of: (a) receiving a precharge command for precharging the semiconductor memory device; and (b) generating an automatic pulse as an initializing signal in response to the received precharge command.

To achieve still another aspect of the above objective, there is provided a method for generating an initializing signal including the steps of: (a) receiving a mode set command for setting an operational mode of the semiconductor memory device; and (b) generating an automatic pulse as an initializing signal in response to the received mode set command.

To achieve still another aspect of the above objective, there is provided a method for generating an initializing signal capable of preventing initial unstable operations of inner circuits installed in a semiconductor memory device which includes an initializing circuit for preventing the inner circuits from being initially unstably operated due to the application of external electric power. The method includes the steps of: (a) the initializing circuit generating a pre-initializing signal in response to the external electric power; (b) receiving a mode set command for setting an operational mode of the semiconductor memory device; and (c) generating an automatic pulse in response to the pre-initializing signal and the received mode set command. The method may further include step (d) of turning off the initializing circuit in response to the generated initializing signal.

To achieve still another aspect of the above objective, there is provided a method of turning off an initializing circuit for generating an initializing signal capable for preventing inner circuits installed in a semiconductor memory device from being initially unstably operated due to application of external electric power, according to a fifth embodiment of the present invention. The method includes the steps of: (a) the initializing circuit generating an initializing signal in response to the external electric power; (b) receiving a precharge command or precharging the semiconductor memory device; and (c) turning off the initializing circuit in response to the precharge command.

To achieve still another aspect of the above objective, there is provided a method of turning off an initializing circuit for generating an initializing signal capable of preventing inner circuits installed in a semiconductor memory device from being initially unstably operated due to application of external electric power. The method includes the steps of: (a) the initializing circuit generating an initializing signal in response to the outer source of electric power; (b) receiving a mode set command for setting an operational mode of the semiconductor memory device; and (c) turning off the initializing circuit in response to the mode set command.

To achieve still another aspect of the above objective, there is provided a method of generating an initializing signal for initializing the inner circuits in a semiconductor memory device, the method including the steps of: (a) receiving a mode set command for initializing the inner circuits; and (b) generating a control signal in response to the received mode set command and using the control signal as the initializing signal.

The mode set command is a signal applied to the semiconductor memory device via an external pin. Also, the mode set command is a mode register set (MRS) command in a synchronous dynamic random access memory (DRAM), and a Write Column address strobe (CAS) Before Row address strobe (RAS) (WCBR) in an asynchronous dynamic random access memory (DRAM).

To achieve still another aspect of the above objective, there is provided a method of generating an initializing signal for initializing the inner circuits in a semiconductor memory device, the method including the steps of: (a) receiving a precharge command for precharging the semiconductor memory device; (b) receiving a mode set command for initializing the inner circuit after receipt of the precharge command; and (c) generating a control signal in response to the received mode set command, and using the control signal as the initializing signal. The mode set command is a signal applied to the semiconductor memory device via an external pin. Also, the mode set command is a mode register set (MRS) command in a synchronous dynamic random access memory (DRAM), and a Write Column address strobe (CAS) Before Row address strobe (RAS) (WCBR) in an asynchronous dynamic random access memory (DRAM).

BRIEF DESCRIPTION OF THE DRAWINGS

The above objective and advantages of the present invention will become more apparent by describing in detail preferred embodiments thereof with reference to the attached drawings in which.

DETAILED DESCRIPTION OF THE INVENTION

Figure 1:
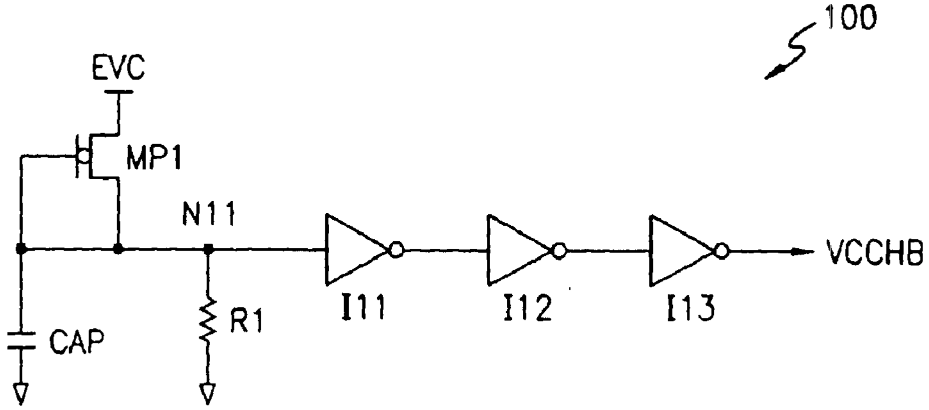
FIG. 1 is a circuit diagram of an initializing circuit capable of preventing unstable operations of inner circuits during power-up.
Figure 2:
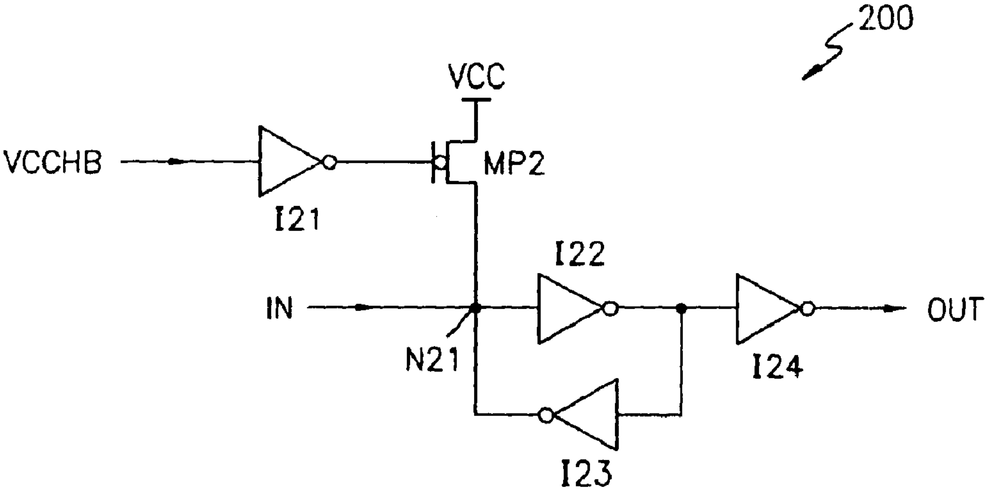
FIG. 2 is a circuit diagram of an initializing circuit that utilizes an initializing signal.

The objectives and advantages of the present invention will become apparent by describing in detail embodiments thereof with respect to the appended drawings. Like reference numerals in the drawings denote like method steps.

When external electric power EVC is applied, a semiconductor memory device sequentially receives a precharge command for precharging the semiconductor memory device, a refresh command and a mode set command. These commands are given when external electric power EVC is applied to the semiconductor memory device. When the semiconductor memory device has received these commands, it operates upon receipt of commands related to operations. The first embodiment of the present invention concerns a method of generating an initializing signal by an initializing circuit through these initial commands which are given when the external electric power EVC is applied to the semiconductor memory device.

Figure 3:
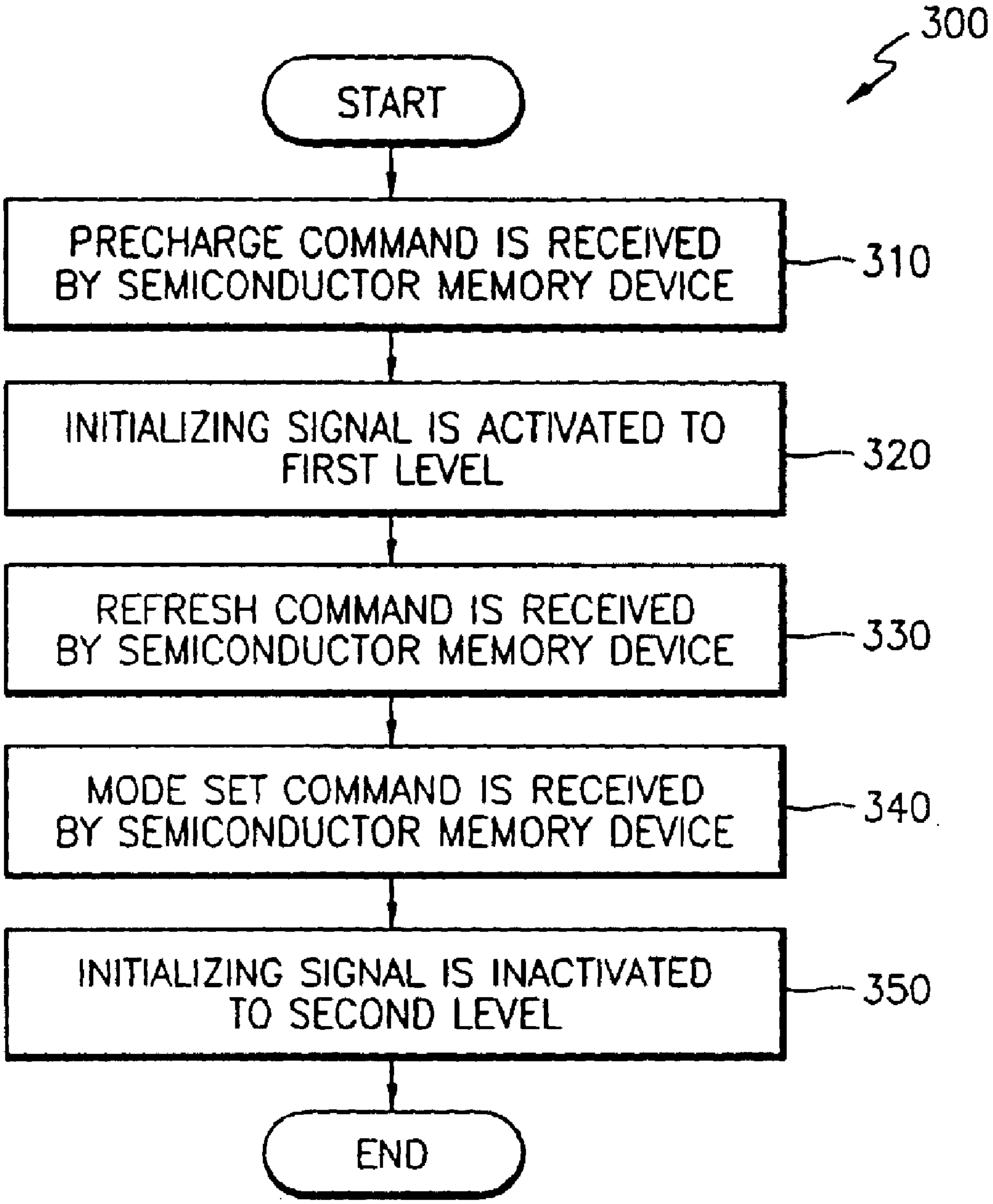
FIG. 3 is a flowchart illustrating a method of generating an initializing signal according to a first embodiment of the present invention.

Referring to FIG. 3, in a method 300 of generating an initializing signal according to the first embodiment of the present invention, a precharge command for precharging the semiconductor memory device is sent to the semiconductor memory device after external electric power is applied to the semiconductor memory device (step 310). Once the precharge command is acknowledged, a signal for precharging is generated to perform precharging operations. Apart from the precharging operations, the initializing signal is activated to a first level in response to the precharging command (step 320). The initializing signal is activated if a semiconductor memory device is configured to have a circuit in which one flag, i.e., a pulse-type signal, is generated. Here, the 'first level' may be a logic 'high' level or a logic 'low' level.

After receiving the precharge command, the semiconductor memory device receives a refresh command for refreshing itself (step 330). Then, in response to the refresh command, the semiconductor memory device is refreshed. Next, the semiconductor memory device receives a mode set command for setting an operational mode of the semiconductor memory device (step 340). The mode set command is a mode register set (MRS) command in a synchronous dynamic random access memory (DRAM) and a write CAS before RAS (WCBR) in an asynchronous DRAM. Then, the semiconductor memory device may receive other commands and performs operations according to the commands.

Next, according to the received mode set command, the initializing signal is deactivated to a second level (step 350). Here, the second level is logic 'low' if the first level is logic 'high', and vice versa, by which the initializing signal is characterized as a pulse signal. The pulse signal serves as an initializing signal. Therefore, according to the first embodiment of the present invention, the unstable operations of the inner circuits can be prevented without the initializing circuit, thus reducing the layout area and power consumption of the initializing circuit. Further, inner circuits otherwise operating unstably during power-up can be stabilized through the initializing signal generated according to the above commands.

Figure 4:
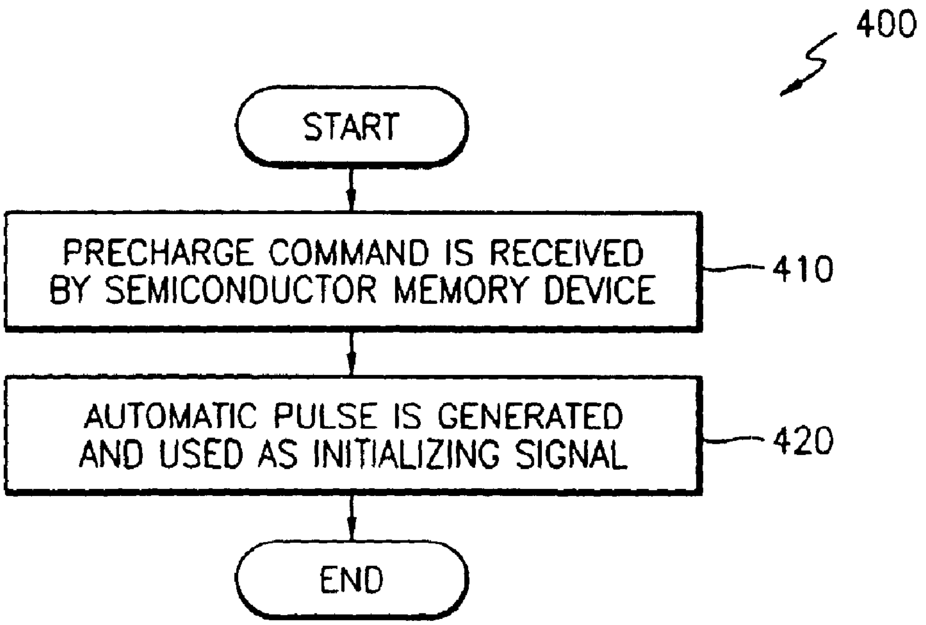
FIG. 4 is a flowchart illustrating a method of generating an initializing signal according to a second embodiment of the present invention.

Referring to FIG. 4, a method 400 of generating an initializing signal according to a second embodiment of the present invention will be described. The method according to the second embodiment of the present invention is different from that according to the first embodiment in which a single pulse signal is generated in response to a precharge command. That is, the semiconductor memory device receives the precharge command for precharging one or more banks thereof with external electric power (step 410). Next, a refresh command and a mode set command are sequentially received by the semiconductor memory device. However, in addition to these commands, the semiconductor memory device responds to the received precharge command and generates an automatic pulse used as an initializing signal (step 420). The automatic pulse can be generated by installing in the semiconductor memory device an automatic pulse generator that generates a pulse signal in response to the precharge command. The pulse signal generated by the automatic pulse generator serves as an initializing signal generated by the initializing circuit. Therefore, the method of generating an initializing signal according to the second embodiment produces the same effects as those according to the first embodiment.

Figure 5:
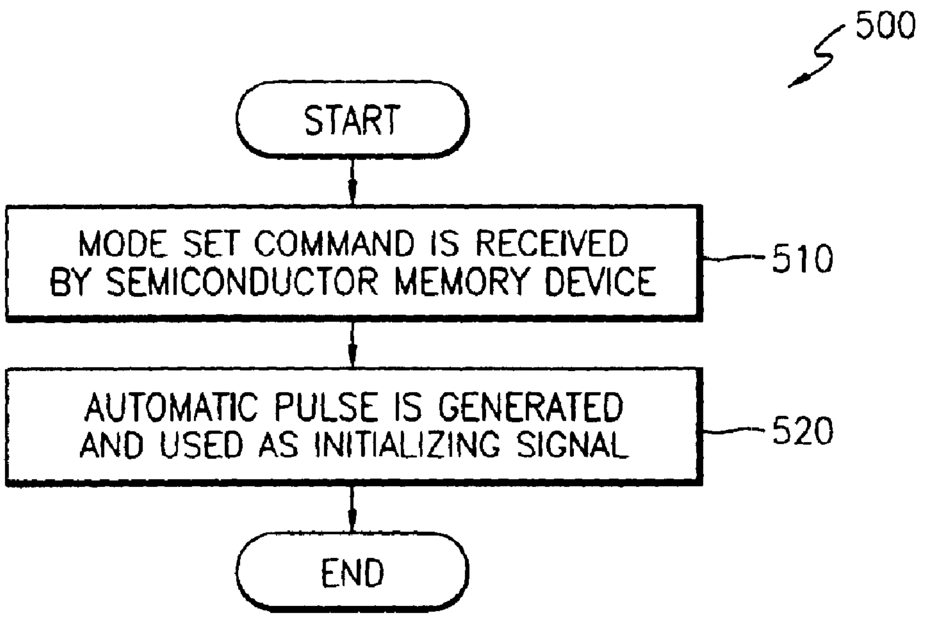
FIG. 5 is a flowchart illustrating a method of generating an initializing signal according to a third embodiment of the present invention.

Referring to FIG. 5, a method 500 for generating an initializing signal according to a third embodiment of the present invention will be described. The third embodiment is different from the first and second embodiments of the present invention in that a pulse is generated in response to a mode set command. That is, after external electric power is applied, the mode set command for setting an operational mode of a semiconductor memory device is received by the semiconductor memory device (step 510). Then, the semiconductor memory device responds to the received mode set command and generates an automatic pulse serving as an initializing signal (step 520), which can be realized if an automatic pulse generator, which generates a pulse signal in response to the mode set command, is included in the semiconductor memory device. Here, as in the first embodiment, the mode set command is a mode register set (MRS) command in a synchronous DRAM and a write CAS before RAS (WCBR) in an asynchronous DRAM. A pulse signal generated by the automatic pulse generator serves as an initializing signal generated by the initializing circuit. Therefore, the effects of the third embodiment are the same as those of the first and second embodiments.

Prior to the step 510, the method 500 for generating an initializing signal according to the third embodiment of the present invention may further include steps of receiving a precharge command for precharging the semiconductor memory device and of receiving a refresh command for refreshing the semiconductor memory device.

Figure 6:
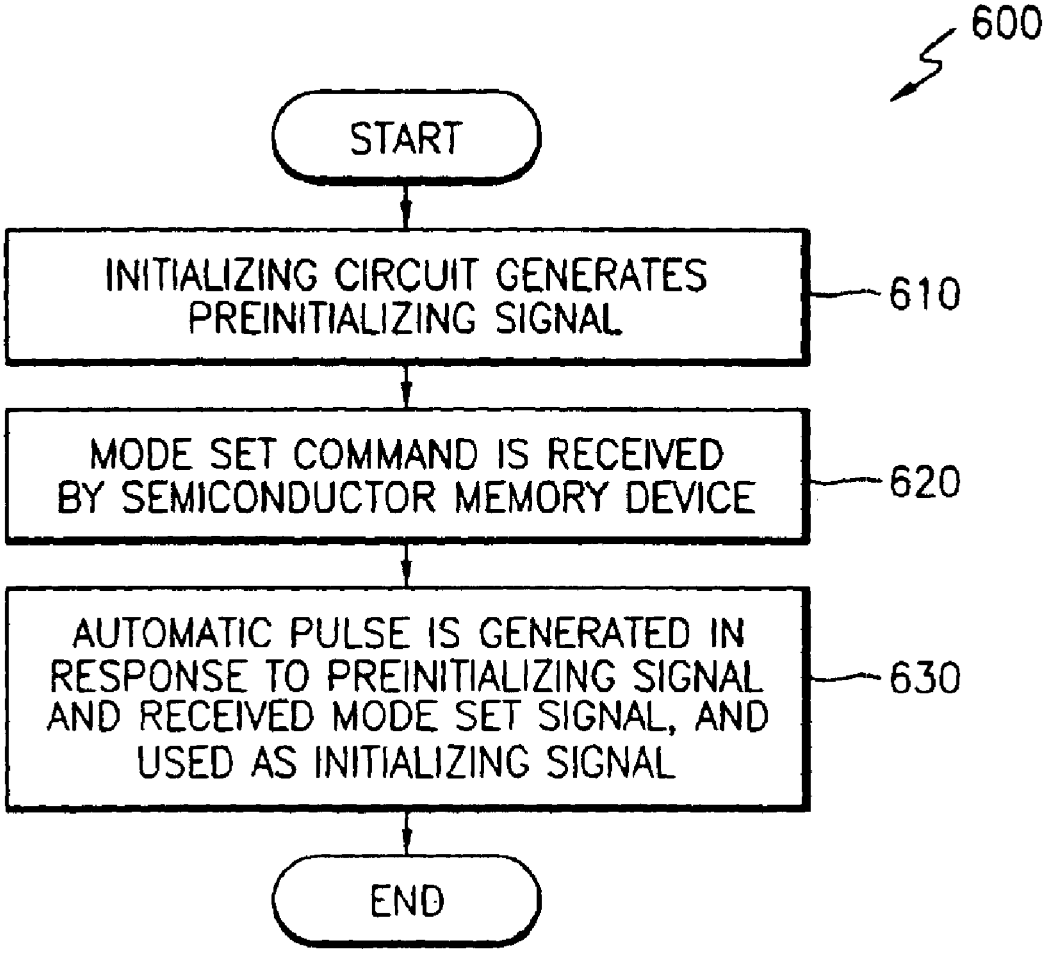
FIG. 6 is a flowchart illustrating a method of generating an initializing signal according to a fourth embodiment of the present invention.

Referring to FIG. 6, a method 600 of generating an initializing signal according to the fourth embodiment of the present invention will be described. The fourth embodiment is different from the first through third embodiments in that it further includes an initializing circuit for preventing initial unstable operations of inner circuits installed in a semiconductor memory device.

According to the method 600, an initializing circuit generates a preinitializing signal in response to external electric power (step 610). The preinitializing signal is identical with the signal VCCHB output from the initializing circuit 100 shown in FIG. 1 and stabilizes the inner circuits.

Next, the semiconductor memory device receives the mode set command (step 620) and generates an automatic pulse to be used as an initializing signal in response to the preinitializing signal and the received mode set command (step 630). This can be realized by including in the semiconductor memory device an automatic pulse generator that generates a pulse signal in response to the preinitializing signal and the mode set command. As a voltage level of external electric power EVC decreases, that of the preinitializing signal decreases. Thus, while the external electric power is applied, the inner circuits can be more reliably initialized by a pulse signal which is generated in response to both the preinitializing signal and the mode set command and serves as an initializing signal, rather than being responsive only to the preinitializing signal. Here, as in the first embodiment, the mode set command is a mode register set (MRS) command in a synchronous DRAM and a write CAS before RAS (WCBR) in an asynchronous DRAM. The method according to the fourth embodiment of the present invention further includes a step of turning off the initializing circuit in response to a generated initializing signal. Therefore, power consumption due to the flow of a constant DC current through the initializing circuit after power-up can be reduced.

Between the steps 610 and 620, the method 600 according to the fourth embodiment of the present invention may further include steps of receiving the precharge command for precharging the semiconductor memory device and of receiving the refresh command for refreshing the semiconductor memory device after the receipt of the precharge command.

Figure 7:
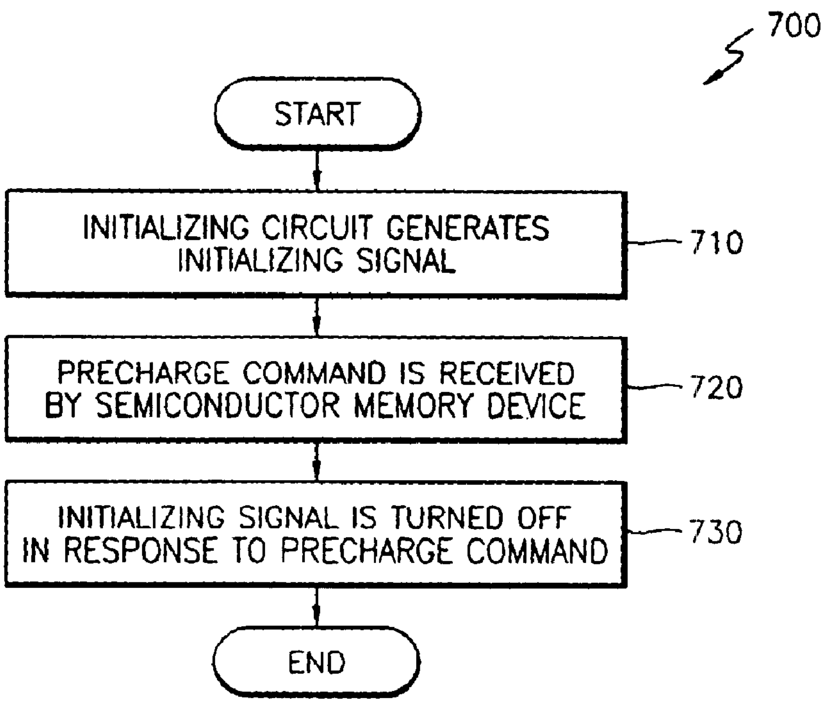
FIG. 7 is a flowchart illustrating a method of turning off an initializing circuit according to a fifth embodiment of the present invention.

FIG. 7 is a flowchart illustrating a method 700 for turning off the initializing circuit according to a firth embodiment of the present invention. In the method 700, an initializing circuit generates an initializing signal in response to external electric power applied to the semiconductor memory device (step 710). The initializing signal is equal to a signal VCCHB output from the initializing circuit 100 shown in FIG. 1 and initializes inner circuits installed in the semiconductor memory device. Then, a precharge command for precharging the semiconductor memory device is received by the semiconductor memory device (step 720). Thereafter, a refresh command and a mode set command are sequentially received by the semiconductor memory device. At this time, apart from these commands, the semiconductor memory device responds to the received precharge command and turns off the initializing circuit (step 730). This can be realized by implementing a circuit capable of turning off the initializing circuit in response to the precharge command. Thus, after power-up, it is possible to reduce power consumption caused by a constant DC current flowing in the initializing circuit.

Figure 8:
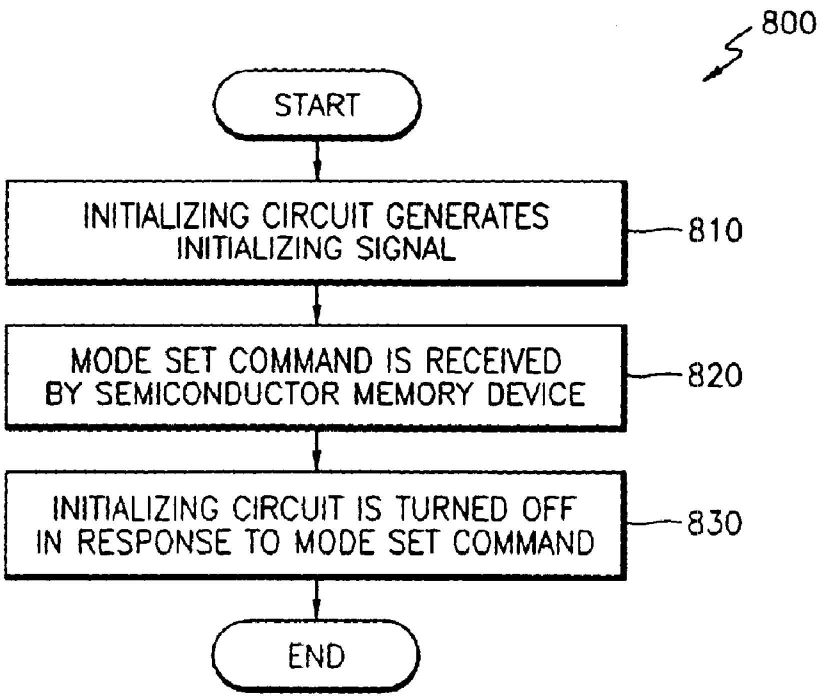
FIG. 8 is a flowchart illustrating a method of turning off an initializing circuit according to a sixth embodiment of the present invention.

In a method of turning off an initializing circuit according to a sixth embodiment of the present invention referring to FIG. 8, the initializing circuit generates an initializing signal in response to the application of external electric power (step 810). The initializing signal (which is the same as the signal VCCHB output from the initializing circuit 100 shown in FIG. 1) initializing inner circuits installed in the semiconductor memory device. Next, the semiconductor memory device receives a mode set command (step 820) and turns off the initializing circuit in response to the received mode set command (step 830). The turning off of the initializing circuit can be realized by implementing a circuit that is capable of turning off the initializing circuit in response to the mode set command. Accordingly, it is possible to reduce power consumption caused by a constant DC current flowing in the initializing circuit after power-up. Here, as in the first embodiment, the mode set command is a mode register set (MRS) command in a synchronous DRAM and a write CAS before RAS (WCBR) in an asynchronous DRAM.

Between steps 810 and 820, the method of turning off the initializing circuit according to the sixth embodiment of the present invention may further include steps of receiving the precharge command for precharging the semiconductor memory device and receiving the refresh command for refreshing the semiconductor memory device after receipt of the precharge command.

Figure 9:
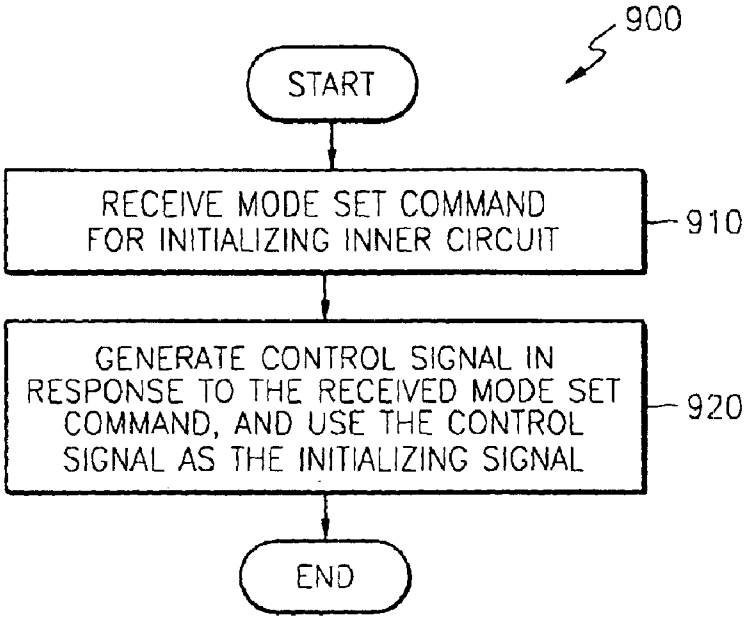
FIG. 9 is a flowchart illustrating a method of generating an initializing signal according to a seventh embodiment of the present invention.

FIG. 9 is a flow chart illustrating a method 900 of generating an initializing signal according to a seventh embodiment of the present invention. In the method 900, a mode set command for initializing an inner circuit in a semiconductor memory device is received (step 910). Next, a control signal is generated in response to the received mode set command and used as the initializing signal (step 920).

The methods according to the first through sixth embodiments are to initialize unstable operations of inner circuits during power-up of a semiconductor memory device. That is, a general initializing circuit initializes inner circuits during power-up of a semiconductor memory device but cannot initialize them during operations of the semiconductor memory device that has already powered on. On the other hand, in the method 900 according to the seventh embodiment, it is possible to initialize inner circuits during the operation of a semiconductor memory device.

In the method 900, a mode set command for initializing inner circuits in a semiconductor memory device is received (step 910). The mode set command is a mode register set (MRS) command in a synchronous dynamic random access memory (DRAM) but is a Write Column address strobe (CAS) Before Row address strobe (RAS) (WCBR) in an asynchronous DRAM.

If there is a need to initialize a semiconductor memory device during its operation, the MRS command for generating an initializing signal is freshly asserted. That is, the existing MRS command is newly set to generate the initializing signal.

After step 910, a control signal is generated in response to the mode set command and used as the initializing signal (step 920). That is, the newly set MRS command generates the control signal. Here, the control signal is a signal that has a pulse shape. In general, an initializing signal generated by an initializing circuit has a pulse shape, and thus, a control signal of a pulse shape can be also used as an initializing signal.

In addition, the mode set command may be a signal that is applied to the semiconductor memory device via an external pin. That is, a pin, which can apply a signal for initializing the semiconductor memory device during its operation, is additionally attached to the external pin-out packaging of a semiconductor memory chip. To initialize the semiconductor memory device, a signal, which is the mode set command, is applied to the semiconductor memory device via the external pin. In this case, the mode set command is a signal of a pulse shape rather than the MRS command.

Figure 11:
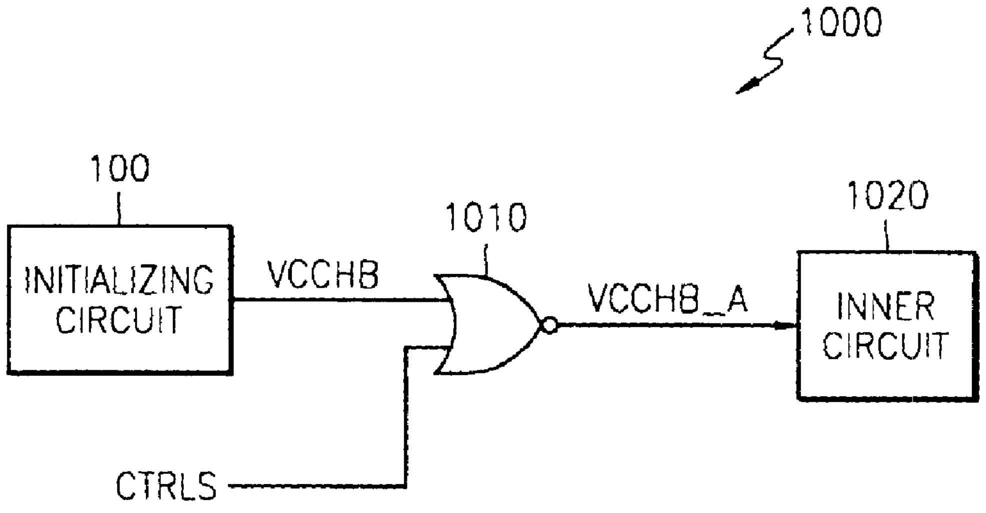
FIG. 11 is a block diagram for explaining the method illustrated in FIG. 9.
Figure 12:
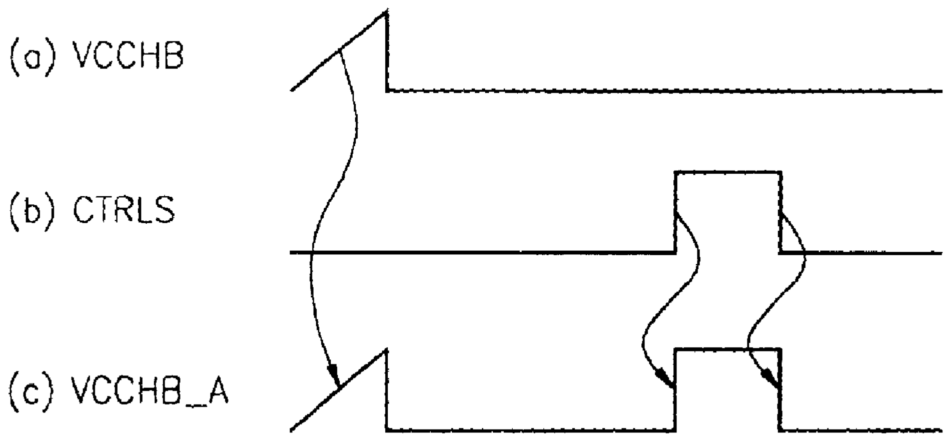
FIG. 12 is a waveform diagram of the initializing signal and control signal shown in FIG. 11.

FIG. 11 is a block diagram for explaining the method 900 shown in FIG. 9 and FIG. 12 is a waveform diagram of an initializing signal and a control signal shown in FIG. 11. Referring to FIG. 11, an initializing circuit 100 has the same structure as the existing initializing circuit for generating an initializing signal VCCHB shown in FIG. 1. An inner circuit 1020 can be set to be initialized when the initializing signal VCCHB is at a high level or a low level, the levels depending on the inner structure of the initializing circuit 100. Here, as a matter of convenience, the inner circuit 1020 is described to be initialized in response to the high-level initializing signal VCCHB.

During power-up of the semiconductor memory device, a voltage level of an external power source increases, and the level of the initializing signal VCCHB, which is a signal output from the initializing circuit 100, increases following the voltage level of the external power source and decreases to a low level when the outer power source reaches a predetermined voltage level (see FIG. 12(*a*)).

During the power-up operation, a control signal CTRLS is at a low level and the initializing signal VCCHB is at a high level. Thus, a high-level initializing control signal VCCHB_A is generated by an OR means 1010 (depicted as a NOR gate), and the inner circuit 1020 is initialized in response to the initializing control signal VCCHB_A.

If the level of the initializing signal VCCHB is changed to be a low level, then the initializing control signal VCCH_A is also at a low level. If the initializing control signal VCCHB_A is at a low level, then the inner circuit 1020 is not initialized.

If there is a need to initialize the semiconductor memory device during its operation, a mode set command is generated. As previously mentioned, the mode set command may be the MRS command or WCBR. In response to the mode set command, a control signal CTRLS, which has a pulse shape, is generated.

At a rising edge of the control signal CTRLS, the level of the initializing control signal VCCHB_A is changed to be a high level by the OR means 1010 and the inner circuit 1020 is initialized, whereas at a falling edge of the control signal CTRLS, the level of the initializing control signal VCCHB_A is changed to a low level.

Waveforms of the initializing signal VCCHB, the control signal CTRLS and the initializing control signal VCCHB_A are shown in FIG. 12(*a*), (*b*), and (*c*), respectively.

In FIG. 11, the structure of the inner circuit 1020 can be modified to be initialized by applying the control signal CTRLS directly to the inner circuit 1020 without the initializing circuit 100. In this case, the inner circuit 1020 also operates in response to the mode set command or the control signal CTRLS as described above, and thus a detailed description thereof will be omitted here.

Figure 10:
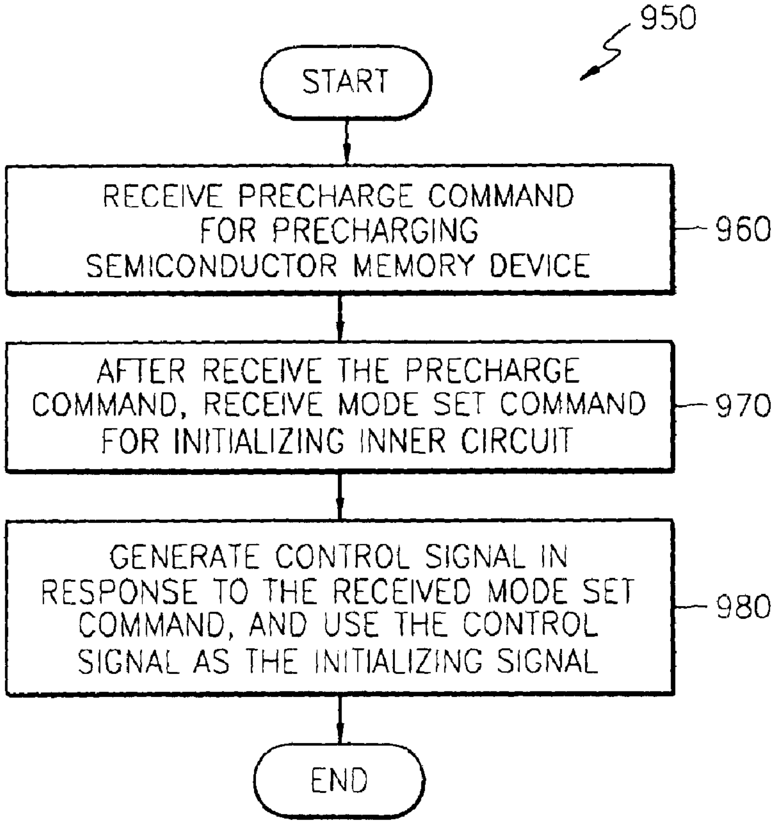
FIG. 10 is a flowchart illustrating a method of generating an initializing signal according to an eighth embodiment of the present invention.

FIG. 10 is a flowchart illustrating a method 950 of generating an initializing signal according to an eighth embodiment of the present invention. In accordance with the method 950, a precharge command for precharging a semiconductor memory device is received (step 960). After step 960, a mode set command for initializing inner circuits in the semiconductor memory device is received (step 970). Next, in response to the mode set command, a control signal is generated and used as the initializing signal (step 980).

The precharge command can be generated during the operation of the semiconductor memory device as well as during power-up thereof. The generation of a precharge command occurs when the semiconductor memory device is carrying out a write or read operation, except when the semiconductor memory device is turning on.

Therefore, the method 950 according to the eighth embodiment is to generate an initializing signal, as in the method 900 according to the seventh embodiment, upon receipt of a precharge command during the operation of the semiconductor memory device. The method 950 is the same as the method 900, except that the state of the semiconductor memory device is determined with the generation of the precharge signal. Thus, a detailed description of the method 950 will be omitted here.

As described above, the methods for generating an initializing signal according to the present invention have advantages of reducing power consumption and the layout area that the initializing circuit, as well as providing more stable and reliable initializing operation of the initializing circuit itself.

While the present invention has been particularly shown and described with reference to the preferred embodiment thereof, the present invention is not restricted to the above embodiment. Further, it will be understood by those skilled in the art that various changes in form and details may be made without departing from the spirit and scope of the invention as defined by the appended claims.

What is claimed is:

1. A method of generating an initializing signal for initializing an inner circuit in a semiconductor memory device, the method comprising:

(a) receiving a mode set command for initializing the inner circuit after receiving a precharge command; and (b) generating a control signal in response to the received mode set command and using the control signal as the initializing signal.

2. The method of claim 1, wherein the mode set command is a signal applied to the semiconductor memory device via an external pin.

3. The method of claim 1, wherein the mode set command is a mode register set (MRS) command in a synchronous dynamic random access memory (DRAM).

4. The method of claim 1, wherein the mode set command is a Write Column address strobe (CAS) Before Row address strobe (RAS) (WCBR) in an asynchronous dynamic random access memory (DRAM).

5. A method of generating an initializing signal for initializing an inner circuit in a semiconductor memory device, the method comprising:

(a) receiving a precharge command for precharging the semiconductor memory device;

(b) receiving a mode set command for initializing the inner circuit after receipt of the precharge command; and (c) generating a control signal in response to the received mode set command, and using the control signal as the initializing signal.

6. The method of claim 5, wherein the mode set command is a signal applied to the semiconductor memory device via an external pin.

7. The method of claim 5, wherein the mode set command is a mode register set (MRS) command in a synchronous dynamic random access memory (DRAM).

8. The method of claim 5, wherein the mode set command is a Write Column address strobe (GAS) Before Row address strobe (RAS) (WCBR) in an asynchronous dynamic random access memory (DRAM).

* * * * *

UNITED STATES PATENT AND TRADEMARK OFFICE

CERTIFICATE OF CORRECTION

PATENT NO. : 6,901,018 B2
APPLICATION NO. : 10/632572
DATED : May 31, 2005
INVENTOR(S) : Bae et al.

It is certified that error appears in the above-identified patent and that said Letters Patent is hereby corrected as shown below:

On the Title Page, under ABSTRACT, line 16, please replace “command foe initializing” with --command for initializing--
At column 10, line 33, please replace “strobe (GAS) Before” with --strobe (CAS) Before--

Signed and Sealed this

Second Day of January, 2007

JON W. DUDAS
*Director of the United States Patent and Trademark Office*